United States Patent [19]
Huang et al.

[11] Patent Number: 5,965,907
[45] Date of Patent: Oct. 12, 1999

[54] FULL COLOR ORGANIC LIGHT EMITTING BACKLIGHT DEVICE FOR LIQUID CRYSTAL DISPLAY APPLICATIONS

[75] Inventors: Rong-Ting Huang, Gilbert, Ariz.; Hsing-Chung Lee, Calabasas, Calif.; Marc H. Wildy, Phoenix; Diana Chen, Gilbert, both of Ariz.

[73] Assignee: Motorola, Inc., Schaumburg, Ill.

[21] Appl. No.: 08/936,225

[22] Filed: Sep. 29, 1997

[51] Int. Cl.$^6$ ........................................ H01L 33/00
[52] U.S. Cl. .................. 257/89; 257/98; 257/103; 313/506
[58] Field of Search .................. 257/40, 88, 89, 257/99, 98, 103; 349/61, 69; 313/502–505, 506

[56] References Cited

U.S. PATENT DOCUMENTS 4,580,877  4/1986  Washo .
5,641,611  6/1997  Shieh et al. .............................. 257/89
5,757,026  5/1998  Forrest et al. ........................... 257/89

*Primary Examiner*—Minh Loan Tran
*Attorney, Agent, or Firm*—Eugene A. Parsons; William E. Koch

[57] ABSTRACT

A full color organic light emitting backlight device for liquid crystal display applications defined by a first OLED panel, designed to emit light in a red bandwidth, a second OLED panel, positioned adjacent the first OLED panel and designed to emit light in a green bandwidth, and a third OLED panel, positioned adjacent the second OLED panel and designed to emit light in a blue bandwidth. The light emitting device having positioned on an uppermost surface a liquid crystal display. The device intended for incorporation into portable electronic devices. The device is fabricated to achieve a full color image using field sequential color techniques.

20 Claims, 2 Drawing Sheets

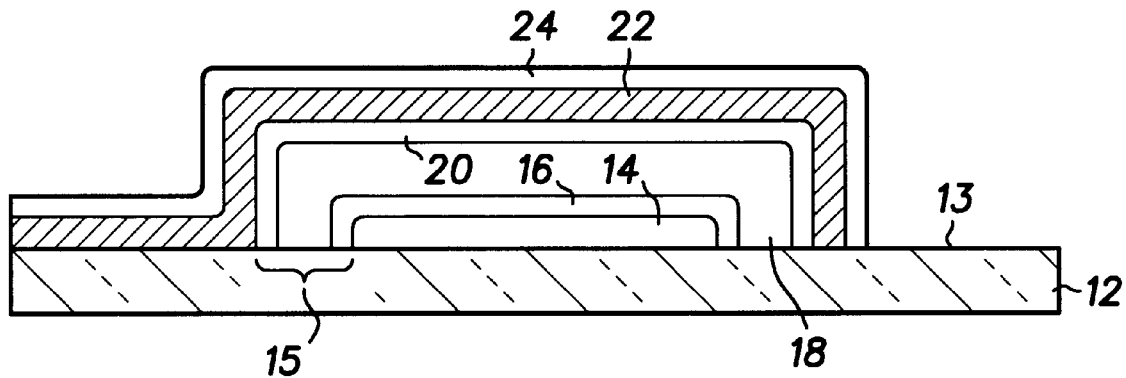
10 FIG. 1
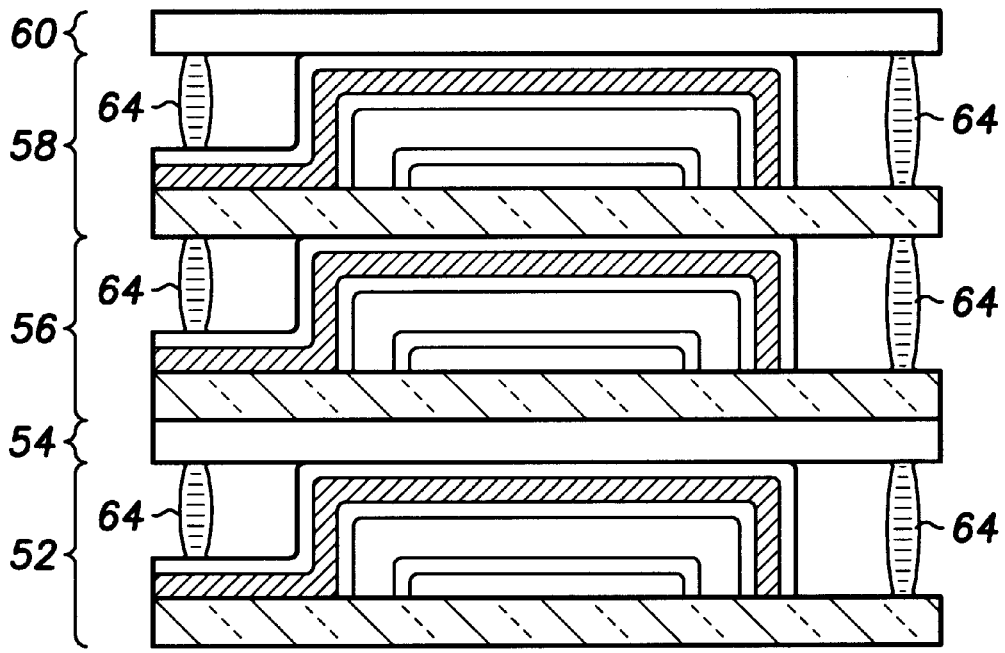
50 FIG. 2

FULL COLOR ORGANIC LIGHT EMITTING BACKLIGHT DEVICE FOR LIQUID CRYSTAL DISPLAY APPLICATIONS

FIELD OF THE INVENTION

The present invention pertains to illumination devices and more specifically to packaging and illumination of OLED backlights for use in liquid crystal displays.

BACKGROUND OF THE INVENTION

Liquid crystal displays (LCDs) are very popular at the present time and are utilized in a great variety of direct view type displays and virtual image displays. Examples of direct view displays in which LCDs are utilized include digital watches, telephones, lap-top computers and the like. Examples of virtual image displays in which LCDs are utilized include camcorder viewfinders, head-mounted displays, or virtual displays in portable electronic equipment, such as portable communications equipment. In general, during operation liquid crystal devices are illuminated with a relatively large, separately mounted light source, preferably from the rear (back-lighting), so that most of the light travels directly through the liquid crystal and outwardly to the eye or eyes of a viewer. In some cases the LCD is front-lit with the light approaching the LCD from the front and reflecting back towards the viewers eye or eyes. Both direct view displays and virtual image displays require a substantial amount of light for suitable viewing. To provide a suitable amount of light or luminance at the outlet, the LCD requires a relatively bright, and large, backlight source. Generally, the result is to produce a relatively large and cumbersome package, usually with several discrete components that is not amenable to incorporation in portable electronic equipment, or the like.

Typically, red, green and blue light emitting devices (LEDs) have been very important to the development of a small LCD backlight. In the past, fluorescent lamps were used to light these small LCDs. Fluorescent lamps work very well at lighting large direct view LCDs, but are a problem at the smaller sizes including virtual image displays. As a general rule, as the length and diameter of the lamps decrease, the efficiency also decreases, making small lamps very power hungry. In addition, the individual red, green and blue emission from the fluorescent lamps cannot be controlled individually, thus field sequential color is difficult.

These problems severely limit the usefulness of liquid crystal displays. For example, in portable electronic devices such as telephones, two-way radios, pagers, etc. the displays are limited to a few alpha-numeric digits viewed as a direct view image. Generally, if a small portable device is desired, the display must be reduced to a very small number of digits, since the size of the display dictates the minimum size of the device into which it is integrated.

One way to alleviate these problems is to use an illumination device in combination with a spatial light modulator (SLM), to act as the image source with a magnifying optical system. This can take the form of a projection display, in which the light modulated by the liquid crystal or SLM is projected by the optical system onto a diffusing screen, or it can take the form of a virtual image display, where the optical system creates a large virtual image of the small image created by the illumination device and SLM combination. In this application the SLM used is an LCD, but it should be understood that other forms of SLMs, such as micromachined silicon, diffractive devices, deformable mirrors, or the like are possible.

When using this configuration as a virtual image display, the number of discrete components still results in a large and cumbersome package. At present, it is extremely difficult to provide a sufficiently large illumination device while maintaining minimal size so that the LCD is properly illuminated, can be viewed conveniently, and is capable of field sequential color to achieve a full color image.

Thus, it would be beneficial to provide for a full color backlight that allows for incorporation into portable electronic devices that utilize liquid crystal displays.

It is a purpose of the present invention to provide for a new and improved illumination device that serves as a backlight for a transmissive liquid crystal display.

It is another purpose of the present invention to provide for a new and improved organic light emitting device (OLED) backlight for use as a LCD illumination device in a liquid crystal display.

It is another purpose of the present invention to provide for a new and improved OLED backlight for use as a LCD illumination device that is hermetically sealed to provide for a more reliable light source.

It is a further purpose of the present invention to provide a new and improved OLED backlight for use as a LCD illumination device which is small and compact enough to be utilized in portable electronic equipment.

It is a still further purpose of the present invention to provide a new and improved OLED backlight for use as a LCD illumination device which requires a sufficiently small amount of power to be utilized in portable electronic equipment.

It is yet another purpose of the present invention to provide a new and improved OLED backlight for use as a LCD illumination device that allows for field sequential color.

It is another purpose of the present invention to provide for a new and improved OLED backlight that has integrated as a part thereof a liquid crystal display.

SUMMARY OF THE INVENTION

The above described problems and others are at least partially solved and the above purposes and others are realized in a full color organic light emitting device (OLED) backlight including a plurality of OLED panels, more particularly a red OLED panel, a green OLED panel, and a blue OLED panel. The plurality of OLED panels each include a substrate element, having disposed thereon a first layer of indium-tin-oxide (ITO). There is positioned on the first layer of ITO, a hole transport layer (HTL), followed by an organic emitter film. Next, there is positioned on the emitter film, an electron transport layer, followed by a metal layer, composed of Mg or Li—Ag. A final layer of ITO is disposed on the metal layer. The panels are fabricated to include a red OLED panel, a green OLED panel, and a blue OLED panel. Once fabricated, the plurality of panels are stacked one on top of the other, using an epoxy material to form a hermetic seal in conjunction with the substrate elements. A liquid crystal display is positioned thereupon the uppermost OLED panel forming a part of the hermetic seal or positioned adjacent the uppermost OLED panel as a separate component. In combination, the plurality of panels and the liquid crystal display thereby forming a complete full color OLED backlight and liquid crystal display.

BRIEF DESCRIPTION OF THE DRAWINGS

Referring to the drawings:

FIG. 1 is a sectional view of a single OLED panel according to the present invention;

FIG. 2 is a sectional view of a plurality of OLED panels and a liquid crystal display stacked together to form a full color OLED backlight with liquid crystal display according to the present invention.

DESCRIPTION OF THE PREFERRED EMBODIMENTS

Figure 3:
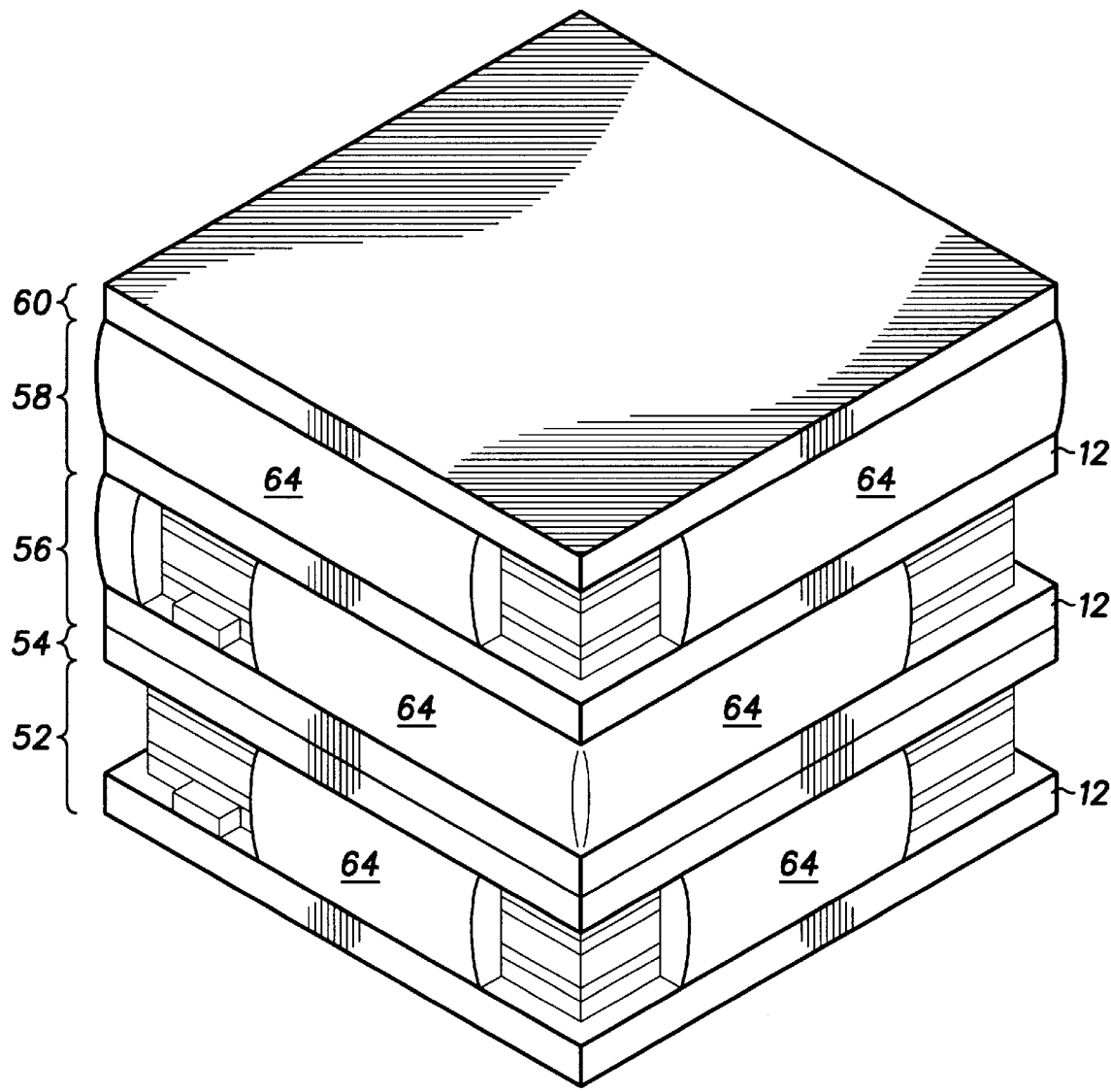
FIG. 3 is a simplified isometric view of a plurality of OLED panels and a liquid crystal display stacked together to form a full color OLED backlight with display according to the present invention.

It should be understood that the drawings are necessarily of a schematic nature, since the thicknesses of the individual layers are too thin to permit depiction to scale or to permit convenient proportionate scaling. Referring specifically to the drawings, wherein like characters indicate like parts throughout the figures, FIG. 1 is a simplified cross-sectional view of a single organic light emitting device (OLED) panel 10 of the present invention.

Referring specifically to FIG. 1, OLED panel 10 is illustrated as including a substrate 12 which is, in this specific embodiment, formed from an optically clear glass. OLED panel 10 further includes a plurality of layers deposited on an upper planar surface 13 of substrate 12, in any of the various methods of fabricating organic LEDs. As in this specific example, OLED panel 10 includes a first conductive layer 14, forming an anode, such as indium-tin-oxide (ITO) or a similar transparent material, with a plurality of organic layers 15, such as an organic electroluminescent layer, positioned thereon and a second conductive layer 24, forming a cathode, formed on a metal layer 22 including a thin layer of a low work function metal. Metal layer 22 is generally formed of a magnesium (Mg) material or a lithium-silver (Li—Ag) material and serves to ensure an efficient electron injection and low operating voltages. The plurality of organic layers 15 is generally comprised of a hole transport layer 16, an emitting layer 18, and an electron transport layer 20. It should be understood that each OLED panel 10 of the present invention is fabricated to emit a specific color, i.e. red, green or blue.

Referring now to FIGS. 2 and 3 illustrated in simplified cross-sectional view and in cut-away isometric view, respectively, is a complete OLED backlight with display 50 according to the present invention. During fabrication of OLED backlight 50, a plurality of individual OLED panels are fabricated, generally similar to OLED panel 10 of FIG. 1. As previously stated, each OLED panel is capable of emitting light of a color different than the previous panel.

OLED backlight 50 in this particular embodiment includes three OLED panels 52, 56 and 58. More particularly, OLED backlight 50 includes a first OLED panel 52 which is fabricated to emit light in a red bandwidth. There is positioned on an uppermost surface of first OLED panel 52, a bandpass filter 54. The red OLED panel, first OLED panel 52, has a broadband spectrum, and therefore bandpass filter 54 having a narrowband pass at a pure red bandwidth is placed between the red OLED panel, first OLED panel 52, and an adjacent OLED panel (discussed presently). Furthermore, in that first OLED panel 52 emits in a red bandwidth, the bandpass filter is positioned on an uppermost surface of OLED panel 52 to improve the red light purity and the full width half maximum (FWHM) of the red spectrum.

A second OLED panel 56 is positioned on an uppermost surface of bandpass filter 54. Second OLED panel 56 is fabricated to emit light in a green bandwidth. Next, a third OLED panel 58 is positioned on an uppermost surface of second OLED panel 56. Third OLED panel 58 is fabricated to emit light in a blue bandwidth. The panels are stacked together, forming a hermetically sealed package, utilizing an epoxy sealant 64. This formation of a hermetic seal improves device reliability.

In an alternative embodiment, the red OLED panel, first OLED panel 52, and bandpass filter 54, are replaced by a green OLED panel that includes fluorescent dye, thereby generating a pure red spectrum emission.

In the preferred embodiment, there is positioned on an uppermost surface of third OLED panel 58, an active matrix transmissive liquid crystal display (LCD), generally formed on either a silicon substrate or a glass substrate. LCD 60 will be used as an image source for a virtual display. The plurality of OLED panels 52, 56 and 58 serve as the backlight module for LCD 60. In an alternative embodiment, the active matrix LCD 60 is maintained as a separate element from the plurality of OLED panels 52, 56 and 58, and an uppermost glass element is included as a part of the backlight module positioned on an uppermost surface of third OLED panel 58. This additional glass element, in combination with epoxy sealant 64, provides for hermetic encapsulation of the plurality of OLED panels 52, 56 and 58.

A contact connected to the first conductive layer 14 on the top of substrate 12, serves as an anode for OLED backlight 50. A contact connected to the second conductive layer 24 on top of metal layer 22 serves as a cathode for OLED backlight 50. With this proposed structure, when the electrodes are connected to a drive circuit (not shown), device 50 is capable of producing a full range of colors using field sequential color techniques, thereby producing a full color image for virtual display applications. In addition, backlight device 50 is capable of generating a white light spectrum by adjusting the ratio of the red emission, the green emission and the blue emission. Accordingly, by activating each OLED panel in accordance with the amount of each color (red, green, or blue) required during the time that the color OLED panel is activated, a complete and full color image is produced for each cycle of the three OLED panels, or a white light is produced. It will of course be understood that more than one OLED panel of each color can be utilized if more than one is required to provide full and uniform illumination.

Thus, a new and improved integrated backlight module with a liquid crystal display is disclosed which is relatively easy and inexpensive to manufacture and having a plurality of OLED panels and an active matrix LCD, or an active matrix liquid crystal on silicon (LCOS) display, encapsulated to form a hermetic seal and/or the LCD or LCOS display positioned adjacently thereto. The plurality of panels conveniently integrate electrical connections to the panels and have provided external connections thereto. Light sources, diffusers, brightness enhancement films and, if desired, additional optics are conveniently positioned exterior the small compact package which is easily integrated into portable electronic equipment. It is further disclosed that additional optical elements, such as polarizer plates or layers, refractive elements, diffractive elements, etc. may be easily positioned exterior the backlight package. By using a plurality of OLED panels as the backlight source, the size of the package is further reduced and the electrical power required is also minimized. Also, by using multicolored OLED panels, a white light or images with partial or full color utilizing field sequential color techniques can be formed.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A full color organic light emitting device for liquid crystal display application comprising:

a first OLED panel, fabricated to emit light of a specific color;

a second OLED panel, fabricated to emit light of a color different than that of the OLED panel, the second OLED panel positioned on an uppermost surface of the first OLED panel;

a bandpass filter positioned between the first OLED panel and the second OLED panel; and a third OLED panel, fabricated to emit light of a color different than that of the first OLED panel and the second OLED panel, the third OLED panel positioned on an uppermost surface of the second OLED panel.

2. A full color organic light emitting device for liquid crystal display applications as claimed in claim 1 further including a liquid crystal display positioned adjacent the third OLED panel.

3. A full color organic light emitting device for liquid crystal display applications as claimed in claim 2 wherein the first OLED panel emits light in a red bandwidth.

4. A full color organic light emitting device for liquid crystal display applications as claimed in claim 3 wherein the second OLED panel emits light in a green bandwidth.

5. A full color organic light emitting device for liquid crystal display applications as claimed in claim 4 wherein the third OLED panel emits light in a blue bandwidth.

6. A full color organic light emitting device for liquid crystal display applications as claimed in claim 5 wherein the first OLED panel, the second OLED panel, the third OLED panel and the liquid crystal display are fabricated to form a hermetically sealed package.

7. A full color organic light emitting device for liquid crystal display applications as claimed in claim 6 wherein the hermetically sealed package is formed using an epoxy sealant.

8. A full color organic light emitting device for liquid crystal display applications comprising:

a first OLED panel, characterized as emitting light in a red bandwidth;

a bandpass filter positioned on an uppermost surface of the first OLED panel;

a second OLED panel, characterized as emitting light in a green bandwidth, the second OLED panel positioned on an uppermost surface of the bandpass filter;

a third OLED panel, characterized as emitting light in a blue bandwidth, the third OLED panel positioned on an uppermost surface of the second OLED panel; and a liquid crystal display positioned on an uppermost surface of the third OLED panel, the liquid crystal display characterized as including one of a silicon substrate and a glass substrate.

9. A full color organic light emitting device for liquid crystal display applications as claimed in claim 8 wherein the first OLED panel includes a substrate element, a first conductive layer positioned on the substrate element, a plurality of organic layers positioned on the first conductive layer, a metal layer positioned on the plurality of organic layers, and a second conductive layer positioned on the metal layer.

10. A full color organic light emitting device for liquid crystal display applications as claimed in claim 9 wherein the second OLED panel includes a substrate element, a first conductive layer positioned on the substrate element, a plurality of organic layers positioned on the first conductive layer, a metal layer positioned on the plurality of organic layers, and a second conductive layer positioned on the metal layer.

11. A full color organic light emitting device for liquid crystal display applications as claimed in claim 10 wherein the third OLED panel includes a substrate element, a first conductive layer positioned on the substrate element, a plurality of organic layers positioned on the first conductive layer, a metal layer positioned on the plurality of organic layers, and a second conductive layer positioned on the metal layer.

12. A full color organic light emitting device for liquid crystal display applications as claimed in claim 11 wherein the first OLED panel, the bandpass filter, the second OLED panel and the third OLED panel are fabricated to form a hermetically sealed package.

13. A full color organic light emitting device for liquid crystal display applications as claimed in claim 12 wherein the hermetically sealed package is formed using an epoxy sealant.

14. A full color organic light emitting device for liquid crystal display applications comprising:

a first OLED panel, characterized as emitting light in a red bandwidth, the first OLED panel including a substrate element, having disposed thereon an uppermost surface a first conductive layer, a plurality of organic layers disposed on the first conductive layer, a metal layer disposed on the plurality of organic layers and a second conductive layer disposed on the metal layer;

a bandpass filter positioned on an uppermost surface of the first OLED panel;

a second OLED panel, characterized as emitting light in a green bandwidth, the second OLED panel including a substrate element, having disposed thereon an uppermost surface a first conductive layer, a plurality of organic layers disposed on the first conductive layer, a metal layer disposed on the plurality of organic layers and a second conductive layer disposed on the metal layer, the second OLED panel being positioned adjacent the bandpass filter;

a third OLED panel, characterized as emitting light in a blue bandwidth, the third OLED panel including a substrate element, having disposed thereon an uppermost surface a first conductive layer, a plurality of organic layers disposed on the first conductive layer, a metal layer disposed on the plurality of organic layers and a second conductive layer disposed on the metal layer, the third OLED panel being positioned adjacent the second OLED panel; and a liquid crystal display positioned adjacent the third OLED panel.

15. A full color organic light emitting device for liquid crystal display applications as claimed in claim 14 wherein the first OLED panel, the second OLED panel, the third OLED panel and the liquid crystal display are hermetically sealed to form the full color organic light emitting device.

16. A full color organic light emitting device for liquid crystal display applications as claimed in claim 15 wherein the hermetic seal is formed using an epoxy sealant.

17. A full color organic light emitting device for liquid crystal display applications as claimed in claim 14 wherein the first and second conductive layers are formed of indium tin oxide (ITO).

18. A full color organic light emitting device for liquid crystal display applications as claimed in claim 17 wherein the plurality of organic layers are formed of a hole transport layer, an emitting layer, and an electron transport layer.

19. A full color organic light emitting device for liquid crystal display applications as claimed in claim 17 wherein the metal layer is formed of one of a magnesium (Mg) material and a lithium silver (Li—Ag) material.

20. A full color organic light emitting device for liquid crystal display applications as claimed in claim 14 wherein the liquid crystal display is characterized by an active matrix liquid crystal display formed on one of a silicon substrate and a glass substrate.

* * * * *